US007161870B2

(12) United States Patent
Zitlaw et al.

(10) Patent No.: US 7,161,870 B2
(45) Date of Patent: Jan. 9, 2007

(54) SYNCHRONOUS FLASH MEMORY COMMAND SEQUENCE

(75) Inventors: Cliff Zitlaw, San Jose, CA (US); Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/877,576

(22) Filed: Jun. 25, 2004

(65) Prior Publication Data

US 2005/0018524 A1   Jan. 27, 2005

Related U.S. Application Data

(63) Continuation of application No. 10/375,768, filed on Feb. 26, 2003, now Pat. No. 6,757,211, which is a continuation of application No. 09/943,473, filed on Aug. 30, 2001, now Pat. No. 6,560,161.

(51) Int. Cl.
*G11C 8/00* (2006.01)

(52) U.S. Cl. ................. 365/230.06; 365/233; 365/193; 365/203; 365/189.01

(58) Field of Classification Search ........... 365/230.06, 365/233, 193, 203, 189.01, 230.01
See application file for complete search history.

(56) References Cited

U.S. PATENT DOCUMENTS

| 5,696,917 | A |   | 12/1997 | Mills et al. |
| 5,748,551 | A | * | 5/1998 | Ryan et al. ............. 365/230.03 |
| 5,822,251 | A |   | 10/1998 | Bruce et al. |
| 6,026,465 | A |   | 2/2000 | Mills et al. |
| 6,104,667 | A |   | 8/2000 | Akaogi |
| 6,104,668 | A |   | 8/2000 | Lee et al. |
| 6,208,564 | B1 |   | 3/2001 | Yamada et al. |
| 6,246,609 | B1 |   | 6/2001 | Akaogi |
| 6,246,626 | B1 | * | 6/2001 | Roohparvar ................. 365/226 |
| 6,266,282 | B1 |   | 7/2001 | Hwang et al. |
| 6,275,446 | B1 |   | 8/2001 | Abedifard |
| 6,278,654 | B1 | * | 8/2001 | Roohparvar ............. 365/238.5 |
| 6,304,488 | B1 |   | 10/2001 | Abedifard et al. |
| 6,304,497 | B1 | * | 10/2001 | Roohparvar ........... 365/189.04 |
| 6,304,510 | B1 |   | 10/2001 | Nobunaga et al. |
| 6,307,779 | B1 |   | 10/2001 | Roohparvar |
| 6,307,790 | B1 |   | 10/2001 | Roohparvar et al. |
| 6,314,019 | B1 | * | 11/2001 | Kuekes et al. .............. 365/151 |
| 6,314,049 | B1 |   | 11/2001 | Roohparvar |
| 6,442,076 | B1 |   | 8/2002 | Roohparvar |
| 6,496,444 | B1 | * | 12/2002 | Roohparvar ................. 365/233 |
| 6,560,161 | B1 | * | 5/2003 | Zitlaw et al. .......... 365/230.06 |
| 6,580,659 | B1 | * | 6/2003 | Roohparvar ................. 365/233 |
| 6,615,307 | B1 |   | 9/2003 | Roohparvar |

(Continued)

FOREIGN PATENT DOCUMENTS

JP          409167484 A   *   6/1997

(Continued)

*Primary Examiner*—Viet Q. Nguyen
(74) *Attorney, Agent, or Firm*—Leffert Jay & Polglaze, P.A.

(57) ABSTRACT

A computer system comprises a memory controller and a synchronous non-volatile memory device coupled to the memory controller via a main memory bus. The synchronous flash memory device, in one embodiment, has a command interface comprising a write enable connection (WE#) to receive a write enable signal, a column address strobe connection (CAS#) to receive a column address strobe signal, a row address strobe connection (RAS#) to receive a row address strobe signal. A command operation is initiated in response to a sequence of ACTIVE/WRITE and/or ACTIVE/READ commands provided on the WE#, CAS# and RAS# connections.

24 Claims, 1 Drawing Sheet

U.S. PATENT DOCUMENTS

| | | |
|---|---|---|
| 6,691,204 B1 * | 2/2004 | Roohparvar |
| 2002/0006074 A1 | 1/2002 | Roohparvar |
| 2002/0024884 A1 | 2/2002 | Roohparvar |
| 2002/0034104 A1 | 3/2002 | Roohparvar |
| 2002/0036922 A1 | 3/2002 | Roohparvar |
| 2002/0044487 A1 | 4/2002 | Roohparvar |
| 2002/0126561 A1 | 9/2002 | Roohparvar |
| 2003/0076733 A1 | 4/2003 | Zitlaw et al. |
| 2003/0117877 A1 | 6/2003 | Roohparvar |
| 2003/0133352 A1 | 7/2003 | Roohparvar et al. |
| 2003/0137885 A1 | 7/2003 | Roohparvar |
| 2003/0151969 A1 | 8/2003 | Zitlaw et al. |

FOREIGN PATENT DOCUMENTS

| | | | |
|---|---|---|---|
| JP | 409265775 A | * | 10/1997 |

* cited by examiner

SYNCHRONOUS FLASH MEMORY COMMAND SEQUENCE

RELATED APPLICATION

This is a continuation application of U.S. patent application Ser. No. 10/375,768, filed Feb. 26, 2003 now U.S. Pat. No. 6,757,211, titled "SYNCHRONOUS FLASH MEMORY COMMAND SEQUENCE" which is a continuation application of U.S. patent application Ser. No. 09/943,473, filed Aug. 30, 2001 now U.S. Pat. No. 6,560,161, titled "SYNCHRONOUS FLASH MEMORY COMMAND SEQUENCE", both of which are commonly assigned and the entire contents of which are incorporated herein by reference.

FIELD OF THE INVENTION

The present invention relates generally to non-volatile memory and in particular the present invention relates to synchronous flash memory.

BACKGROUND OF THE INVENTION

Memory devices are typically provided as internal storage areas in the computer. The term memory identifies data storage that comes in the form of integrated circuit chips. There are several different types of memory. One type is RAM (random-access memory). This is typically used as main memory in a computer environment. Computers typically contain a small amount of read-only memory (ROM) that holds instructions for starting up the computer. Unlike RAM, ROM cannot be written to. An EEPROM (electrically erasable programmable read-only memory) is a special type non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of non-volatile memory that can be erased in blocks instead of one byte at a time. A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

A synchronous DRAM (SDRAM) is a type of DRAM that can run at much higher clock speeds than conventional DRAM memory. SDRAM synchronizes itself with a CPU's bus and is capable of running at high clock speeds. Many computer systems are designed to operate using SDRAM, but would benefit from non-volatile memory. Some synchronous non-volatile memory devices have been provided that use SDRAM commands to allow for easy implementation in current SDRAM systems. These memory devices, however, are susceptible to restrictions and limitations of the SDRAM specific commands.

For the reasons stated above, and for other reasons stated below which will become apparent to those skilled in the art upon reading and understanding the present specification, there is a need in the art for a synchronous non-volatile memory that can be initiated without using restricted SDRAM commands.

SUMMARY OF THE INVENTION

The above-mentioned problems with non-volatile synchronous memories and other problems are addressed by the present invention and will be understood by reading and studying the following specification.

In one embodiment, a synchronous flash memory device comprises an array of non-volatile memory cells, and control circuit to initiate a command operation in response to a predefined sequence of externally provided ACTIVE and READ or ACTIVE and WRITE commands.

In another embodiment, a synchronous flash memory device comprises an array of non-volatile memory cells, and a command register to store command data used to control flash memory operations. The command register is coupled to receive the command data through memory address connections during an initiate command operation mode. The initiate command operation mode is initiated using a sequence of ACTIVE/WRITE commands where WRITE is defined as CAS# signal low, a RAS# signal high, and a WE# signal low.

A method of providing commands in a synchronous flash memory comprise initiating a command register load operation using a predefined combination of ACTIVE/WRITE commands, where WRITE is defined as a low column address strobe (CAS#) signal, a high row address strobe (RAS#) signal, and a low write enable (WE#) signal. Command data is loaded into the command register using address connections of the synchronous flash memory in response to the command register load operation.

A method of providing commands in a synchronous flash memory comprises initiating a command register load operation using a predefined combination of ACTIVE/WRITE commands, where WRITE is defined as a low column address strobe (CAS#) signal, a high row address strobe (RAS#) signal, and a low write enable (WE#) signal, and ACTIVE is defined as a high column address strobe (CAS#) signal, a low row address strobe (RAS#) signal, and a high write enable (WE#) signal. Command data is loaded into the command register using address connections of the synchronous flash memory in response to the command register load operation.

DETAILED DESCRIPTION OF THE DRAWING

Figure 1:
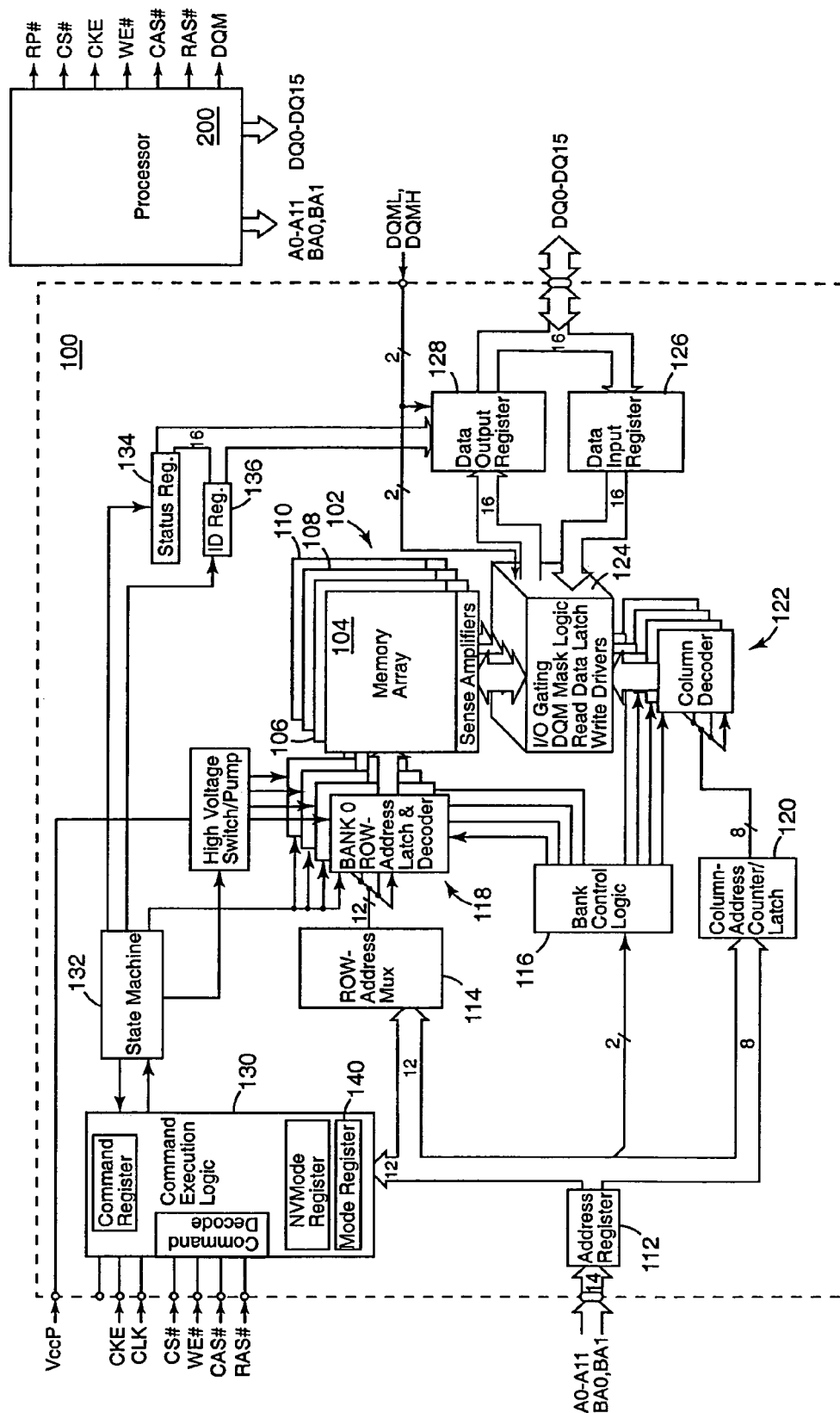
FIG. 1 is a block diagram of an embodiment of the present invention.

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

A synchronous flash memory device is described in U.S. patent application Ser. No. 09/627,682 filed Jul. 28, 2000 and incorporated herein by reference. The flash memory provides the benefits of a non-volatile memory and the communication speeds of a synchronous DRAM. The synchronous flash memory can be operated using a standard SDRAM bus and basic SDRAM commands. Because the flash memory has operational functions not present in SDRAM, and SDRAM requires commands not used by the flash, the command sequences between the memories are not identical.

Referring to FIG. 1, a block diagram of one embodiment of the present invention is described. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output gating, data mask logic, read data latch circuitry and write driver circuitry. Data is input through data input registers 126 and output through data output registers 128. Command execution logic 130 is provided to control the basic operations of the memory device. A state machine 132 is also provided to control specific operations performed on the memory arrays and cells. A status register 134 and an identification register 136 can also be provided to output data. The command circuit 130 and/or state machine 132 can be generally referred to as control circuitry to control read, write, erase and other memory operations. A command or mode register 140 is used to store command information indicating a command operation to be performed by the memory.

An initiate command operation is used to initiate flash memory control commands to the Command Execution Logic (CEL) 130. The CEL receives and interprets commands to the device. This initial command operation is used to load a command register with externally provided command information. These commands also control the operation of the Internal State Machine 132 and the read path (i.e., memory array 102, ID Register 136 or Status Register 134).

Before any READ or WRITE commands can be issued to a bank within the synchronous flash memory, a row in that bank must be "opened." This is accomplished via the ACTIVE command (defined by CS#, WE#, RAS#, CAS#), which selects both the bank and the row to be activated. After opening a row (issuing an ACTIVE command), a READ or WRITE command may be issued to that row.

In contrast to the present invention, to initiate a flash memory operation in the synchronous flash memory device described in U.S. patent application Ser. No. 09/607,041 filed Jun. 30, 2000 (incorporated herein by reference), a sequence of three commands are used. A load command register command (defined by CS# low, RAS# low, CAS# low, WE# high) is used to load an internal command register. The command and corresponding data on address lines indicate which operation is to be performed. The load command register command is the same command signal configuration as an SDRAM REFRESH command.

An ACTIVE command (defined by CS# low, RAS# low, CAS# high, WE# high) is used to open (or activate) a row in a particular array bank for a subsequent access. The ACTIVE command follows the LOAD COMMAND REGISTER command. The value on the bank address inputs selects the bank, and the address provided on address inputs selects the row. This row remains active for accesses until the next ACTIVE command, power-down or RESET.

The READ command (defined by CS# low, RAS# high, CAS# low, WE# low) is used to initiate a read access to an active row. The value on the bank address inputs selects the bank, and the address provided on address inputs selects a starting column location. Read data appears on the DQ's.

A WRITE command (defined by CS# low, RAS# high, CAS# low, WE# low) is used to initiate a single-location write access on an active row. The value on the bank inputs selects the bank, and the address provided on address inputs selects a column location. Examples of an SDRAM Refresh command as used by the synchronous flash memory to begin a command sequence are provided in Table 1. Table 1 illustrates some example command sequences and corresponding addresses for a synchronous flash.

TABLE 1

| Operation | Command 1 | Address | Command 2 | Address | Command 2 | Address | Data |
|---|---|---|---|---|---|---|---|
| Read ID | Refresh | 90h | Active | XX | Read | ID_Add | ID info |
| Read Status | Refresh | 70h | Active | XX | Read | XX | Status |
| Program | Refresh | 40h | Active | Row | Write | Column | Data |
| Erase | Refresh | 20h | Active | Row | Write | XX | D0h |

As illustrated, Command 1 of each three-command sequence takes advantage of the SDRAM Refresh command. The subsequent commands are an Active command followed by either a Read or Write command. Corresponding address signals are used with the refresh command to identify the requested command.

Some processors prevent a user from defining an address during Refresh operations. As such, implementing the synchronous flash memory would require additional glue logic to artificially generate a Refresh command with a user specified address. The present invention provides a synchronous flash memory embodiment that does not use a refresh command code.

A flash memory of the present invention uses multiple commands to implement specific operations. The command sequence is initiated using a write command followed by an Active command that is followed by either a read or write command. The first write command is provided with a command address to define the operation to be performed. The write command, therefore, has two functions. The first function is to specify the internal flash command to be performed. During the third cycle, the write command may specify address and data information used in the command sequence. The present flash memory includes a command and control circuit that monitors the function of the write command. That is, the control circuit tracks the historical use of the write command.

An inadvertent initiation of an internal flash operation may result with the active/(write or read) command sequence. An alternate embodiment of the present invention uses a series of specific active/write commands to initiate a flash operation. Address and data patterns can be used to further identify the initiation 'key'. Table 2 illustrates one example of a command sequence to read a memory identification. This sequence uses six alternating ACTIVE/WRITE and ACTIVE/READ commands with corresponding address data to initiate a load command operation (write operation 90h).

The present invention is not limited to the command sequence of Table 2. The use of both Active and Write commands is also not intended to limit the present invention.

TABLE 2

| Cycle | Command | Data | Address |
|---|---|---|---|
| 1 | Active | XX | 555 |
| 2 | Write | XX | 55 |
| 3 | Active | XX | AAA |
| 4 | Write | XX | AA |
| 5 | Active | XX | XX |
| 6 | Write | XX | 90h |
| 7 | Active | XX | XX |
| 8 | Read | ID_Data | ID_Address |

CONCLUSION

A computer system comprises a memory controller and a synchronous non-volatile memory device coupled to the memory controller via a main memory bus. The synchronous flash memory device, in one embodiment, has a command interface comprising a write enable connection (WE#) to receive a write enable signal, a column address strobe connection (CAS#) to receive a column address strobe signal, a row address strobe connection (RAS#) to receive a row address strobe signal. A command operation is initiated in response to a sequence of ACTIVE/WRITE or ACTIVE/READ commands provided on the WE#, CAS# and RAS# connections.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A synchronous non-volatile memory device comprising:
    an array of non-volatile memory cells; and
    a command register to store command data used to control internal non-volatile memory operations, wherein the command register is coupled to receive the command data through memory address connections during an internal non-volatile memory operating mode, and wherein the internal non-volatile memory operating mode is initiated using a predetermined sequence of ACTIVE, WRITE, and/or READ commands.

2. The synchronous non-volatile memory device of claim 1, wherein the WRITE commands are defined as a low CAS# signal, a high RAS# signal, and a low WE# signal, and the ACTIVE commands are defined as RAS# low, CAS# high and WE# high.

3. The synchronous non-volatile memory device of claim 1, wherein the ACTIVE, WRITE, and/or READ commands are accompanied by command information provided on address input connections.

4. The synchronous non-volatile memory device of claim 1, further comprising a control circuit to perform a read operation following the initiation of the internal non-volatile memory operating mode in response to an ACTIVE command and a READ command.

5. The synchronous non-volatile memory device of claim 1, further comprising a control circuit to perform a program operation following the initiation of the internal non-volatile memory operating mode in response to an ACTIVE command and a WRITE command.

6. A synchronous non-volatile memory device comprising:
    an array of non-volatile memory cells; and
    a command register to store command data used to control internal non-volatile memory operations, wherein the command register has a means for receiving command data through memory address connections during an internal non-volatile memory
    performing a program operation following the initiation of the command register load operation utilizing an ACTIVE command and a WRITE command.

7. The synchronous non-volatile memory device of claim 6, wherein the WRITE commands are defined as a low CAS# signal, a high RAS# signal, and a low WE# signal, and the ACTIVE commands are defined as RAS# low, CAS# high and WE# high.

8. The synchronous non-volatile memory device of claim 6, wherein the ACTIVE, WRITE, and/or READ commands are accompanied by command information provided on address input connections.

9. The synchronous non-volatile memory device of claim 6, further comprising a means for performing a read operation following the initiation of the internal non-volatile memory operating mode in response to an ACTIVE command and a READ command.

10. The synchronous non-volatile memory device of claim 6, further comprising a means for performing a program operation following the initiation of the internal non-volatile memory operating mode in response to an ACTIVE command and a WRITE command.

11. A synchronous non-volatile memory device comprising:
    an array of non-volatile memory cells; and
    a control circuit having a means for initiating an internal non-volatile memory control command operation in an internal non-volatile memory operating mode in response to a predefined sequence of externally provided ACTIVE, WRITE, and/or READ commands.

12. The synchronous non-volatile memory device of claim 11, wherein the ACTIVE, WRITE, and/or READ commands are accompanied by command information provided on address input connections.

13. A synchronous data system comprising:
a processor; and
a synchronous non-volatile memory device coupled to the processor and comprising,
an array of non-volatile memory cells, and
a control circuit to initiate an internal non-volatile memory control command operation in an internal non-volatile memory operating mode in response to a predefined sequence of externally provided ACTIVE, WRITE, and/or READ commands from the memory controller.

14. The synchronous data system of claim 13, wherein a command register is coupled to receive the command information through memory address connections coupled to the memory controller, the command information is loaded in response to the predefined sequence.

15. A method of loading commands in a synchronous non-volatile memory, the method comprising:
initiating a command register load operation using a predefined combination of ACTIVE, WRITE, and/or READ commands, wherein the ACTIVE commands are defined as a high column address strobe (CAS#) signal, a low row address strobe (RAS#) signal, and a high write enable (WE#) signal, and the WRITE commands are defined as a low column address strobe (CAS#) signal, a high row address strobe (RAS#) signal, and a low write enable (WE#) signal; and
loading command information into the command register using address connections of the synchronous non-volatile memory in response to the command register load operation.

16. The method of claim 15, further comprising:
placing command information on address input connections.

17. The method of claim 15, further comprising:
performing a read operation following the initiation of the command register load operation utilizing an ACTIVE command and a READ command.

18. The method of claim 15, further comprising:
performing a program operation following the initiation of the command register load operation utilizing an ACTIVE command and a WRITE command.

19. A method of operating a synchronous non-volatile memory, the method comprising:
initiating a command register load operation in an internal non-volatile memory operating mode using a predefined combination of ACTIVE, WRITE, and/or READ commands.

20. The method of claim 19, wherein the ACTIVE commands are defined as a high column address strobe (CAS#) signal, a low row address strobe (RAS#) signal, and a high write enable (WE#) signal , and the WRITE commands are defined as a low column address strobe (CAS#) signal, a high row address strobe (RAS#) signal, and a low write enable (WE#) signal.

21. The method of claim 19, further comprising:
loading command information into the command register in the internal non-volatile memory operating mode using address connections of the synchronous non-volatile memory in response to the command register load operation.

22. The method of claim 19, further comprising:
placing command information on address input connections.

23. The method of claim 19, further comprising:
performing a read operation following the initiation of the command register load operation utilizing an ACTIVE command and a READ command.

24. The method of claim 19, further comprising:
performing a program operation following the initiation of the command register load operation utilizing an ACTIVE command and a WRITE command. operating mode, and wherein a means for initiating the internal non-volatile memory operating mode is provided using a predetermined sequence of ACTIVE, WRITE, and/or READ commands.

* * * * *

UNITED STATES PATENT AND TRADEMARK OFFICE
CERTIFICATE OF CORRECTION

| | | |
|---|---|---|
| PATENT NO. | : 7,161,870 B2 | Page 1 of 1 |
| APPLICATION NO. | : 10/877576 | |
| DATED | : January 9, 2007 | |
| INVENTOR(S) | : Cliff Zitlaw and Frankie Fariborz Roohparvar | |

It is certified that error appears in the above-identified patent and that said Letters Patent is hereby corrected as shown below:

Column 4, lines 37 to 50, in TABLE 1, replace the second occurrence of "Command 2" with --Command 3--.

Column 6, lines 33 to 35, delete the text beginning "performing a program operation" and ending "and a WRITE command." and insert the following text: --operating mode, and wherein a means for initiating the internal non-volatile memory operating mode is provided using a predetermined sequence of ACTIVE, WRITE, and/or READ commands.--.

Column 8, lines 34 to 38, delete the text beginning " operating mode, " and ending "READ commands."

Signed and Sealed this

Twenty-seventh Day of November, 2007

JON W. DUDAS
*Director of the United States Patent and Trademark Office*